US009671507B2

(12) United States Patent
Bensaoula et al.

(10) Patent No.: US 9,671,507 B2
(45) Date of Patent: Jun. 6, 2017

(54) SOLID-STATE NEUTRON DETECTOR DEVICE

(71) Applicant: University of Houston System, Houston, TX (US)

(72) Inventors: Abdelhak Bensaoula, Houston, TX (US); David Starikov, Houston, TX (US); Rajeev Pillai, Manvel, TX (US)

(73) Assignee: UNIVERSITY OF HOUSTON SYSTEM, Houston, TX (US)

( * ) Notice: Subject to any disclaimer, the term of this patent is extended or adjusted under 35 U.S.C. 154(b) by 82 days.

(21) Appl. No.: 14/667,409

(22) Filed: Mar. 24, 2015

(65) Prior Publication Data

US 2015/0276950 A1    Oct. 1, 2015

Related U.S. Application Data

(60) Provisional application No. 61/970,841, filed on Mar. 26, 2014.

(51) Int. Cl.
*H01L 33/00* (2010.01)
*G01T 3/08* (2006.01)
*H01L 31/115* (2006.01)
*H01L 31/18* (2006.01)

(52) U.S. Cl.
CPC ............ *G01T 3/08* (2013.01); *H01L 31/115* (2013.01); *H01L 31/1804* (2013.01); *H01L 31/1856* (2013.01)

(58) Field of Classification Search
CPC ............... H01L 31/1804; H01L 31/115; H01L 31/1856; H01L 31/18; H01L 31/02; H01L 21/0237; H01L 21/02439; H01L 29/12; H01L 31/0256; H01L 33/26

See application file for complete search history.

(56) References Cited

U.S. PATENT DOCUMENTS

| | | | | |
|---|---|---|---|---|
| 5,625,202 A | * | 4/1997 | Chai | H01L 33/007 257/103 |
| 5,851,310 A | * | 12/1998 | Freundlich | B82Y 20/00 136/252 |
| 8,022,369 B2 | * | 9/2011 | Orava | G01T 3/08 250/370.05 |

(Continued)

FOREIGN PATENT DOCUMENTS

| | | |
|---|---|---|
| EP | 1531344 A1 | 5/2005 |
| WO | 00/33106 A1 | 6/2000 |

(Continued)

OTHER PUBLICATIONS

Korean Intellectual Property Office; International Search Report and Written Opinion; PCT Application No. PCT/US2015/022296: Jul. 3, 2015.

(Continued)

*Primary Examiner* — Thomas L Dickey
*Assistant Examiner* — Damon Hillman
(74) *Attorney, Agent, or Firm* — Jackson Walker LLP

(57) ABSTRACT

The structure and methods of fabricating a high efficiency compact solid state neutron detector based on III-Nitride semiconductor structures deposited on a substrate. The operation of the device is based on absorption of neutrons, which results in generation of free carriers.

20 Claims, 10 Drawing Sheets

(56) References Cited

U.S. PATENT DOCUMENTS

| | | | |
|---|---|---|---|
| 2007/0295985 A1* | 12/2007 | Weeks, Jr. | H01L 29/0657 257/183 |
| 2011/0049379 A1 | 3/2011 | Moses | |
| 2011/0095193 A1 | 4/2011 | Orava et al. | |
| 2011/0110628 A1* | 5/2011 | Okamoto | H01L 31/0232 385/37 |
| 2011/0163242 A1 | 7/2011 | Mao et al. | |
| 2011/0284755 A1 | 11/2011 | Stradins et al. | |
| 2013/0048070 A1* | 2/2013 | Hazeghi | H01L 31/062 136/256 |
| 2013/0075848 A1 | 3/2013 | Nikolic et al. | |
| 2013/0292685 A1* | 11/2013 | Jiang | H01L 31/0304 257/76 |
| 2014/0319560 A1* | 10/2014 | Tischler | H01L 29/00 257/98 |
| 2015/0028353 A1* | 1/2015 | Mandal | H01L 31/036 257/77 |

FOREIGN PATENT DOCUMENTS

| | | |
|---|---|---|
| WO | 2004/040332 A2 | 5/2004 |
| WO | 2006/085307 A1 | 8/2006 |
| WO | 2007/030156 A2 | 3/2007 |
| WO | 2007/109535 A2 | 9/2007 |
| WO | 2009/117477 A2 | 9/2009 |
| WO | 2010/011859 A2 | 1/2010 |
| WO | 2011/002906 A1 | 1/2011 |
| WO | 2011/025853 A1 | 3/2011 |
| WO | 2011/051299 A2 | 5/2011 |
| WO | 2011/051300 A2 | 5/2011 |
| WO | 2012/012101 A2 | 1/2012 |
| WO | 2012/146415 A2 | 11/2012 |
| WO | 2013/032549 A1 | 3/2013 |
| WO | 2013/096267 A1 | 6/2013 |
| WO | 2013/116241 A1 | 8/2013 |
| WO | 2013/176719 A1 | 11/2013 |

OTHER PUBLICATIONS

The Notification concerning Transmittal of International Preliminary Report on Patentability and the International Preliminary Report on Patentability mailed by the International Bureau of WIPO on Oct. 6, 2016.

* cited by examiner

SOLID-STATE NEUTRON DETECTOR DEVICE

This application claims priority to U.S. Provisional Patent Application Ser. No. 61/970,841, entitled "Compact Solid-State Neutron Detector," filed Mar. 26, 2014, the entire content of which is hereby incorporated by reference.

This invention was made with support, in parts, of the NASA Small Business Innovation Research program. The government may have certain rights in the invention.

BACKGROUND

The present disclosure relates generally to solid-state neutron detectors, and more specifically to the structure and fabrication of high sensitivity compact solid-state neutron detectors.

Low energy neutron ($E_n<1$ eV) detection plays an increasingly critical role in many applications including medicine, high energy physics (HEP), and home land security. Currently two inch helium-3 ($^3$He) tube neutron detectors can achieve detection efficiencies of up to 80%, while portable handheld one inch $^3$He tube neutron detectors can achieve efficiencies of 10-15%. These efficiencies are reasonable for detection of thermal neutrons in high flux environments, such as in HEP applications, however they become impractical in low flux environments, such as in detecting presence of radioactive material for homeland security. Moreover, since the discovery of the scarcity of $^3$He, substitute neutron detectors have become a priority. $^3$He is a rare isotope of helium primarily obtained from radioactive decay of tritium, and since the end of the cold war the United States have consistently reduced their nuclear stockpile making the helium isotope scarce. Also, the demand of helium-3 isotopes have increased primarily for use in neutron detectors, and current supplies are not able to meet the demand.

One alternative approach has been the use of scintillator, water-based, and semiconductor type detectors. Thus far the major challenge with semiconductor detectors is the ability to fabricate very thick layers of semiconducting materials and fabricate efficient devices from them. Thick layers are typically required due to the low neutron capture cross sections of most available semiconductors. For example, the neutron capture cross-section of silicon-28 isotope is ~1 barn ($10^{-24}$ cm$^2$), compared to boron-10 ($^{10}$B), which is close to 3,840 barns. If for example, $^{10}$B is used as the converter material to a semiconductor type neutron detector, alpha particles (1.47 MeV) and lithium-7 ($^7$Li) (0.84 MeV) particles are generated, which travel through the semiconductor and generate electron-hole pairs that are collected by the contacts. However, the absorption of these particles in the convertor material boron is very high with a mean free path of only 3.3 μm, which means they would be absorbed within boron, before getting to the semiconductor interface. If the thickness of the converter material is reduced, the neutron absorption drops resulting in lower efficiencies.

Currently used large area detectors for neutron detection in HEP testing facilities for research are facing a shortage in the source of helium-3. Moreover, the helium gas tubes are bulky mechanically and thermally unstable, and therefore pose several risks to developing portable neutron detectors. Alternative neutron technologies that employ $^{10}$B and boron trifloride (BF$_3$) lined proportional detectors and lithium-6 ($^6$Li) scintillators are promising, but are still bulky and require high voltages (>1000 V). Portable neutron detectors developed by PartTec manufacturing employ $^6$LiF:ZnS(μg) scintillators that emit blue light at 420 nm that is collected in wavelength shifting optical fibers and converted to 500 nm (green) photons still employ high sensitivity photon multiplier tubes (PMTs) which are bulky, mechanically and thermally unstable, and expensive. Moreover, the combination of fiber optic cables and PMTs make it difficult to realize handheld portable neutron detectors.

In contrast, semiconductor based devices can have a low operating voltage, small device footprint, and excellent stability. The dilemma is how to best utilize semiconductors to design an optimized thermal neutron detector. Most semiconductor materials have very low neutron capture cross-sections, the most common approach to fabricate solid state neutron detectors is to coat the semiconductor devices with materials that have higher capture cross-sections. Thus the neutron absorbing layer generates charged ions and ionizing radiation that are detectable by the semiconductor. The ions are only detectable if the mean free path of the charged particle is sufficient enough to reach the interface of the semiconductor/moderator. Thus conventional neutron sensitive thin-film coated semiconductors face the challenge of balancing the neutron absorption efficiency in the thin film and charge transfer efficiency to the semiconductor junction. Thin film semiconductor neutron detectors have low neutron capture efficiency, for example $Mg_2B_{14}$ thin films deposited on silicon diodes have an efficiency of only 1.3%.

In order to overcome this challenge, researchers have employed solid form semiconductor devices that are composed at least partially by a neutron sensitive material. Typically solid form semiconductors are grown by chemical vapor deposition (CVD) and have the neutron sensitive material embedded in the crystal of the semiconductor. However, these techniques are usually very expensive and not suitable for growing thick films.

One material recently developed by Stowe et. al. is a $^6$LiInSe$_2$ that utilizes the $^6$Li capture cross-section of 938 barns as a bulk semiconductor. The material developed using the bridgeman method, has a bandgap of 2.85 eV and a high bulk resistivity of $3.17\times10^{11}$ Ω-cm. The material is claimed to have very high neutron detection efficiencies compared to $^3$He tube detectors, primarily due to the close packed nature of the $^6$Li atoms in the crystal compared to $^3$He atoms in gaseous form. Thus utilizing materials with higher neutron capture cross-sections will only further improve the neutron detection efficiency and enable the development of handheld low cost and low power neutron detectors.

Recent developments on improvement of the growth quality of III-Nitride materials and the availability of GaN wafers, allow for the development of high efficiency harsh environment resistant devices. The group III-Nitride ternary compounds composed of $Al_xGa_{1-x}N$ (bandgap 6.2 to 3.42 eV) and $In_xGa_{1-x}N$ (bandgap 3.42 to 0.62 eV) exhibit inherent chemical and thermal ruggedness, which makes them suitable for several space and military applications. It has recently been determined that these Nitride materials can also offer exceptional radiation tolerance that is well beyond what can be achieved with conventional materials that are currently flown in space. For example silicon based detectors have shown up to 65% loss under irradiation of $10^{12}$ protons/cm$^2$. III-Nitride materials present several advantages over other semiconducting materials currently used for optoelectronic devices. These include: 1) intrinsic radiation hardness; 2) ability to tune the bandgap from 6.2 eV to 0.62 eV; 3) layers of different bandgaps can been grown using well developed MBE or MOCVD methods; 4) large bandgap resulting in low thermal noise; 5) negative electron affinity (NEA) enabling field emission capabilities; 6) high degrees of chemical, mechanical, and thermal stability, plus high resistance to sputtering.

Gadolinium isotopes 155 and 157 have higher capture cross sections compared to any other materials, with $^{155}$Gd having a cross section of 65,000 barns and $^{157}$Gd having a cross section of 255,000 barns. Most important is that the mean free path of neutrons in $^{157}$Gd is only 1.3 μm, and a thickness of 6 μm is sufficient to stop 99% of thermal neutrons (25 meV).

GdN is a semiconductor with a half metallic bandgap calculated to be ~0.6 eV, however, recent experimental evidence based on the optical absorption spectrum of rf magnetron sputter deposited GdN have shown bandgaps ranging from 1.03 eV to 0.95 eV. The lattice constant of bulk GdN (111) is about 4.9 Å, however, GdN (111) plane has a hexagonal symmetry that matches with the 0001 plane of InN with a lattice mismatch close to 0%. High quality growth of GdN (111) has been attempted on GaN and AlN films, however due to the lack of readily available InN substrates, to the best of our knowledge, it has not been attempted on InN.

Naturally occurring Gd has a neutron capture cross section of 49,700 barns, which is much higher than those of most materials. Compared to $^{6}$Li, the capture cross-section is more than 50 times higher for naturally occurring Gd, and it is more than 500 times higher if $^{157}$Gd is used. Of high interest is that Gd easily forms GdN, which is a semiconductor with an experimental bandgap of ~1 eV. GdN (111) plane has a hexagonal symmetry that matches with the 0001 plane of III-Nitride materials. Several groups have grown GdN on GaN and MN, and have demonstrated polycrystalline quality GdN materials. FIG. 1 shows the alignment of the face centered cubic (fcc) structure of GdN with the hexagonal structure of GaN. The in-plane N—N interatomic distance is given by 4.9/√2=3.52 Å, where 4.9 Å is the lattice constant of GdN, this leads to a biaxial strain of −9.4%, that eventually leads to polycrystallinity.

In contrast, the InN lattice constant is 3.54 Å, making InN a perfect substrate match for GdN. However, due to the lack of readily available InN substrates and/or "templates", there has been no work demonstrating the potential growth of GdN on InN.

Patent publication WO2013032549 describes a portable thermal neutron detector based on an array of Si CMOS transistors covered with a Gd containing film, such as gadolinium oxide, deposited by plasma enhanced atomic layer deposition.

Another patent publication, WO2011002906, describes at least thermal neutron detection with a capacitor type solid-state device based on gadolinium oxide deposited on low resistivity semiconductor substrate.

Patent publication WO2006085307 describes a solid-state device for detection of neutron and alpha particles detector that has an active region formed of a polycrystalline semiconductor compound containing $^{10}$Boron, $^{6}$Lithium, $^{113}$Cadmium, $^{157}$Gadolinium and $^{199}$Mercury. The semiconductor compound is sandwiched between an electrode assembly by using an organic or inorganic binder.

Patent publication WO2009117477 describes a silicon-on-insulator (SOI) neutron detector device with lateral carrier transport and collection detector structure within the active semiconductor layer of the silicon-on-insulator structure, and a neutron to high energy particle converter layer on the active semiconductor layer that includes cadmium, gadolinium, gadolinium phosphate, gadolinium oxide, and their combinations.

Patent publication WO2007030156 describes a device for neutron detection having semiconductor-based elements synthesized and used in the form of semiconductor dots, wires, or pillars on or in a semiconductor substrate embedded with matrixes of high cross-section neutron converter materials that can emit charged particles upon interaction with neutrons. These charged particles in turn can generate electron-hole pairs and thus detectable electrical current and voltage in the semiconductor elements.

High efficiency neutron detection can be achieved by using a design described in the patent publication WO2004040332. The detector utilizes a semiconductor wafer with a matrix of spaced cavities filled with one or more types of neutron reactive material such as $^{10}$B or $^{6}$LiF. The cavities are etched into both the front and back surfaces of the device such that the cavities from one side surround the cavities from the other side. The cavities may be etched via holes or etched slots or trenches. The cavities can be also different-sized and the smaller cavities extend into the wafer from the lower surfaces of the larger cavities. In one of the other embodiments multiple layers of different neutron-responsive material are formed on one or more sides of the wafer.

Publication number WO2010011859 discloses a room temperature operating solid state hand held neutron detector that integrates one or more relatively thin layers of a high neutron interaction cross-section element or materials with semiconductor detectors. The high neutron interaction cross-section element (e.g., Gd, B, or Li) or materials comprising at least one high neutron interaction cross-section element can be in the form of unstructured layers or micro- or nano-structured arrays. Such architecture provides high efficiency neutron detector devices by capturing substantially more carriers produced from high energy a-particles or Y-photons generated by neutron interaction.

Publication number US 20130075848 describes a three-dimensional boron particle loaded thermal neutron detectors utilizing neutron sensitive conversion materials in the form of nano-powders and micro-sized particles, as opposed to thin films, suspensions, paraffin, etc. More specifically, methods to infiltrate, intersperse, and embed the neutron nano-powders to form two dimensional and/or three-dimensional charge sensitive platforms are specified. The use of nano-powders enables conformal contact with the entire charge-collecting structure regardless of its shape or configuration.

Publications EP2494375 and WO2011051300 describe a device for detecting neutrons that comprises a neutron reactive material, a semiconductor element being coupled with the neutron reactive material, and electrodes are arranged for collecting the electrical charges and to provide electrically readable signal. The thickness of the first semiconductor element is so low that it is transparent for incident photons, such as background gamma photons. Pulsed laser deposition (PLD) is mentioned as one of the preferable methods for deposition of the neutron reactive material on the semiconductor surface.

There remains a need for solid-state neutron detectors that are highly efficient, compact, producible at low cost, and capable of alleviating decreased neutron detection efficiency in harsh environmental conditions.

SUMMARY

The present disclosure relates generally to solid-state neutron detectors, and more specifically to the structure and methods for fabricating high sensitivity compact solid-state neutron detectors.

Solid-state neutron detectors can be used in a variety of techniques, ranging from medicinal practices to high energy physics (HEP) to space and military operations. The present disclosure relates to the structure and method for fabricating solid-state neutron detectors which are highly efficient, compact and producible at low cost. The present solid-state neutron detectors also alleviate decreased neutron detection efficiency in harsh environmental conditions.

In one embodiment, the neutron detector device comprises a first contact, a capping layer, a neutron absorption layer comprising a plurality of interdigitated layers of at least two distinct materials, a graded layer, a substrate further comprising a top substrate layer, and a second contact.

In another embodiment, the neutron detector device comprises a first contact, a capping layer, a neutron absorption layer comprising a plurality of micro- or nano-column structures of at least two distinct materials; a substrate, and a second contact.

The present disclosure also relates to methods for fabricating a neutron detection device comprising a first contact, a capping layer, a neutron absorption layer comprising a plurality of interdigitated layers of at least two distinct materials, a graded layer, a substrate further comprising a top substrate layer, and a second contact.

Additionally, the present disclosure relates to methods for fabricating a neutron detection device comprising a first contact, a capping layer, a neutron absorption layer comprising a plurality of micro- or nano-column structures of at least two distinct materials, a substrate, and a second contact.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views, and in which.

DETAILED DESCRIPTION OF PREFERRED EMBODIMENTS

Figure 1:
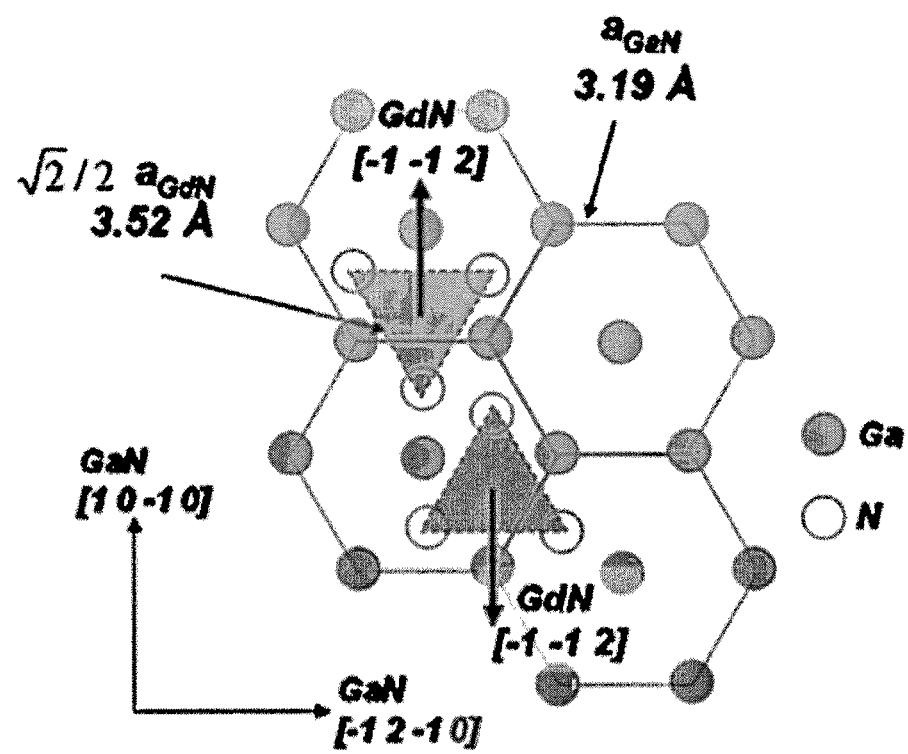
FIG. 1 shows a schematic representation of GdN lattice alignment with GaN structure.

In the description that follows, like parts are marked throughout the specification and drawings with the same reference numerals. The drawing figures might not be to scale and certain components can be shown in generalized or schematic form and identified by commercial designations in the interest of clarity and conciseness.

Interdigitated Layer Structure

Figure 2:
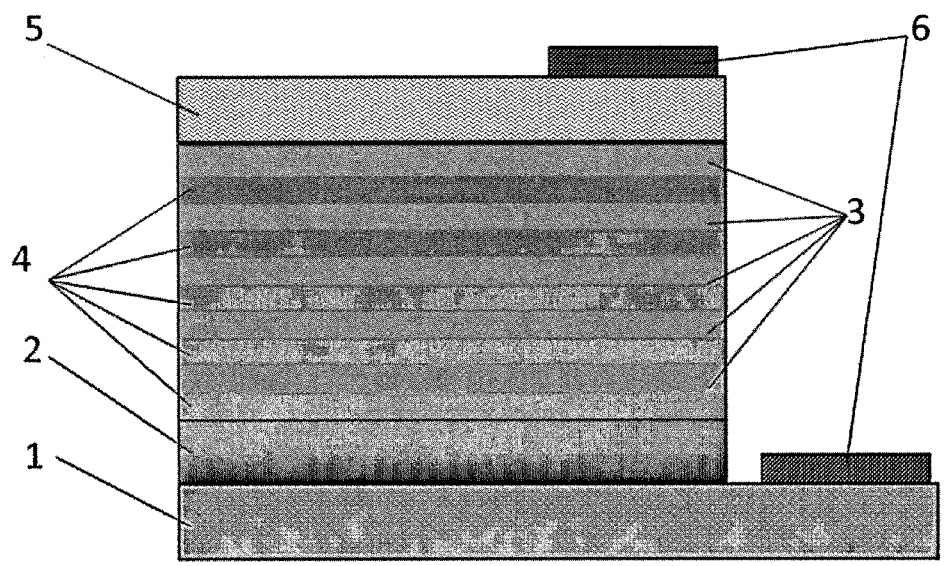
FIG. 2 shows a side view in accordance with an exemplary embodiment of the present disclosure.

The device structure of a first exemplary embodiment is shown in FIG. 2. It consists of a high crystalline quality GaN layer (1), a graded GaN/InGaN/InN layer (2), interdigitated GdN (3) and InN (4) layers, a capping ZrN layer (5), and metal contacts to the top ZrN layer and the bottom GaN layer(6).

The operation of the device is based on absorption of neutrons by the Gd atoms in the GdN layers, which results in generation of free carriers. These carriers can be collected if a p-n junction is present in the structure. For example, such p-n junction is formed if the GdN/InGaN interdigitated structure is of n-type, and the bottom GaN layer is of p-type.

If all the layers in the structure are electrically conductive, but do not form a p-n junction, generated carriers will add to the current resulted from a bias applied between the two contacts in the bottom and on the top of the device structure.

If any of the layers in the GaN/InGaN/InN graded layer or in the interdigitated GdN/InN exhibit dielectric properties (because, for example, of extremely low doping concentration or amorphous nature) the capacitance of the structure can be measured at a pulsed voltage applied to the contacts as a function of charge carriers generated during absorption of neutrons by Gd atoms.

While using Gd isotopes will greatly benefit the device efficiency, naturally occurring Gd can be used for a proof of concept in the first embodiment. Naturally occurring Gd has a neutron capture cross-section of 49,700 barns, which is still much higher than many other materials used for neutron detection.

The lattice constants of InN and GaN are 3.54 Å and 3.19 Å, respectively, which results in up to 10% lattice mismatch. In order to generate minimum defects associated with this mismatch, a graded GaN/InGaN/InN layer (2) is grown first by PAMBE on commercial templates of low defect density GaN pre-grown by MOCVD on sapphire substrates(1). Then >12 μm thick heterostructure comprising of interdigitated GdN (3) and InN (4) layers(>1.2 μm thick each) is grown using RF assisted DC magnetron co-sputtering, followed by the deposition of a capping ZrN layer (5). The structure is patterned, and etched by using reactive ion etching (RIE) to expose the bottom GaN layers (1) and separate pixels in the array. Metal contacts (6) are deposited then on the top of the capping layer (5) and onto the exposed GaN template layer (1) by using vacuum evaporation or sputtering.

In one embodiment of the present disclosure, the capping layer, interdigitated layer, and graded layer do not alter their performance under harsh environments (unless exposed to Cl+ and/or F+ ion containing plasmas and/or temperatures above 250 ° C.)

Method of Fabricating Interdigitated Layer Structure

First the GaN on sapphire template wafer is cleaned using a standard process followed by etching in concentrated sulfuric acid, DI water rinse, and nitrogen dry, before it is loaded into the PAMBE system and a graded GaN/InGaN/InN structure is grown by using conditions optimized in our previous experiments on the growth of InGaN with high (>80%) In content. The sample then is loaded into the sputtering chamber for deposition of interdigitated InN and GdN layers.

The sputtering chamber is equipped with 3 sputter guns that allow for co-sputtering. Each gun has a separate individually controlled $N_2$ input allowing for variation of the $N_2$ flow rate and optimization of the deposition conditions for each individual layer. The sputtering system is also equipped with a water cooled quartz crystal monitor that allows in situ monitoring of the deposition rate.

The substrate is degassed in the chamber at a temperature above 800 ° C. and then the substrate temperature is kept at 700 ° C. and 500 ° C. during the GdN and InN depositions, respectively. The individual sputter rates and deposition parameters for of each of the materials has to be optimized by utilizing the growth conditions developed in the previous experiments.

The next step requires a capping layer to prevent the GdN layer from oxidation. A recommended option is to sputter ZrN as the capping layer, since it is highly conductive, almost transparent to neutrons, and can act as a contact layer while also being a very inert material.

The RIE etching is performed through a pre-patterned photoresist mask by using a mixture of chlorine and argon gases. The etch rates have to be accurately determined in order to etch mesas that will divide the active device structure on pixels and expose the bottom contact layer. Ohmic metal contacts are deposited on the exposed by RIE bottom GaN layer and the top ZrN layer by using standard vacuum evaporation or sputtering.

Nano or Micro Column Structure

Figure 3:
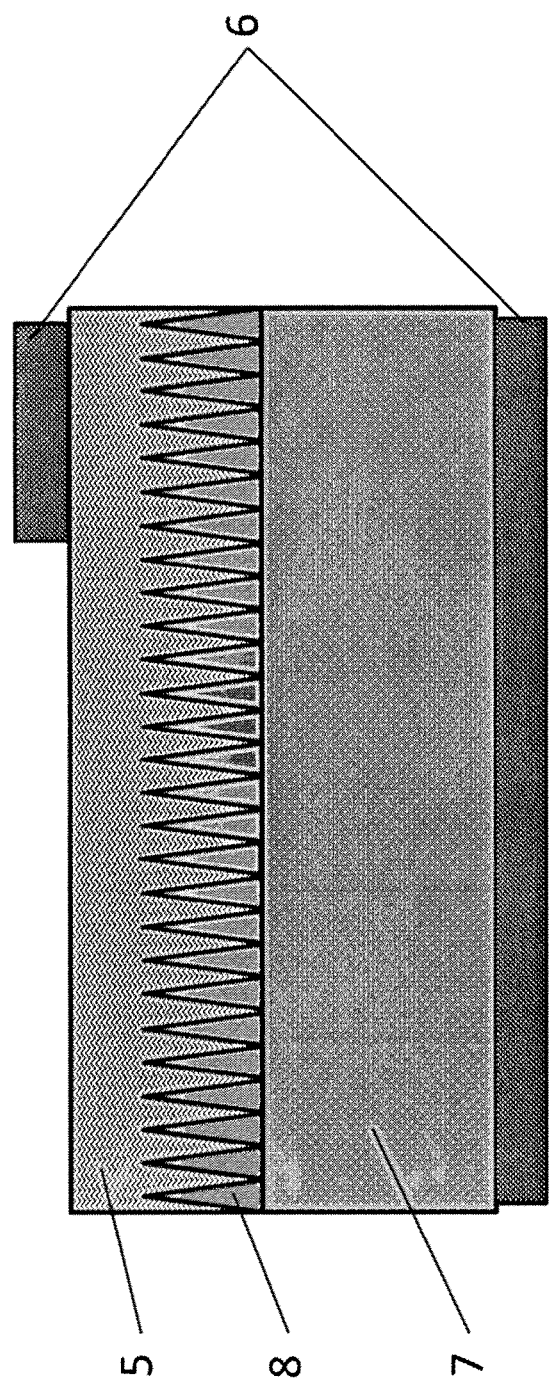
FIG. 3 shows a side view in accordance with an exemplary embodiment of the present disclosure.

The device structure of the second embodiment is shown in FIG. 3. It consists of a semiconductor silicon substrate (7), a nano or micro column structured Gd containing layer (8), a capping ZrN layer (5), and metal contacts to the top ZrN layer and the bottom of the silicon substrate (6).

The operation of the device is based on absorption of neutrons by the Gd atoms in the nano or micro column structured Gd containing layer. After passing through almost completely transparent ZrN layer (5) the neutrons interact with the Gd atoms generating free carriers. These carriers can be collected if a p-n junction is present in the structure. For example, such p-n junction is formed if the laser ablation structured Gd containing layer is of p-type, and the semiconductor silicon substrate is of n-type.

The Gd containing layer (8) is structured as an array of nano or micro columns with high height-to-width aspect ratio and density. Upon absorption of neutrons by the Gd atoms these nano or micro columns will emit scattered charged particles that can generate additional electron hole pairs resulting in the increase of the detection efficiency of the device.

If all the layers in the structure are electrically conductive, but do not form a p-n junction, generated carriers will add to the current resulted from a bias applied between the two contacts in the bottom and on the top of the device structure.

If any of the layers in the structure exhibit dielectric properties (because, for example, of extremely low doping concentration or amorphous nature) the capacitance of the structure can be measured at a pulsed voltage applied to the contacts as a function of charge carriers generated during absorption of neutrons by Gd atoms.

Method of Fabricating Nano or Micro Column Structure

First a commercial n-type doped silicon substrate with doping concentration in the range $-10^{14}$-$10^{18}$ cm$^{-3}$ is cleaned and placed in the sputtering system chamber. Then 6 interdigitated Gd and B layers (~1 µm thick each) are sputtered starting with Gd and ending with B on entire silicon wafer surface. Ending with a B layer protects highly oxidizing Gd during exposure to the atmosphere. The silicon wafer covered with interdigitated Gd/B layer structure is then placed in the pulsed laser ablation processing chamber. The laser ablation is performed in vacuum or argon atmosphere provided by the processing chamber gas supply system.

Figure 4:
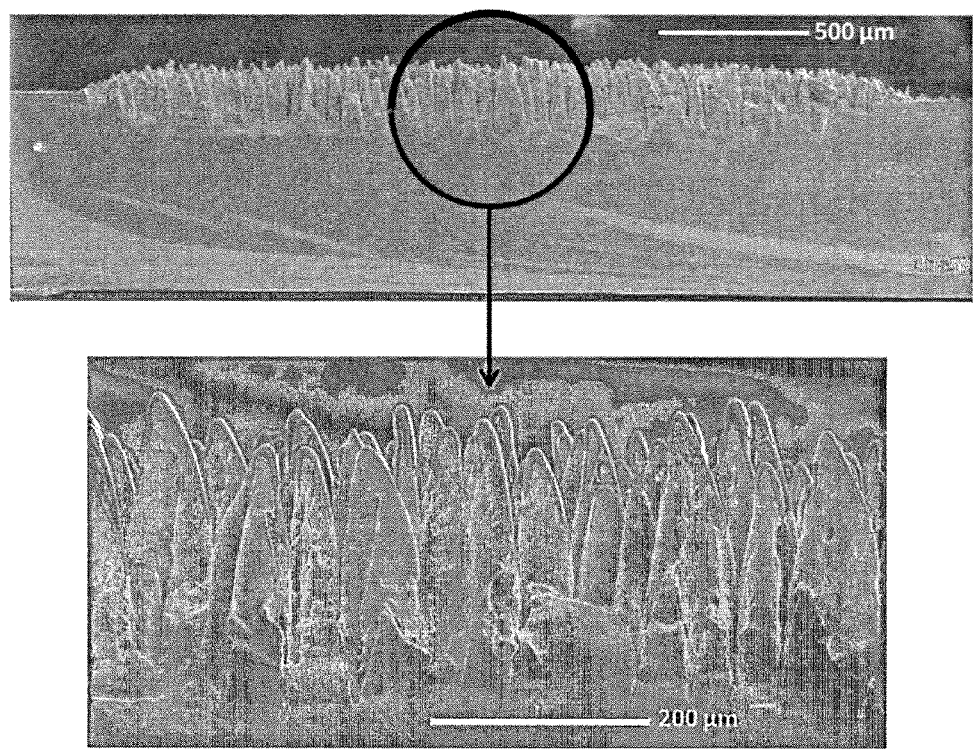
FIG. 4 shows a side view SEM image of micro columns fabricated on a silicon wafer using pulsed laser ablation in accordance with an exemplary embodiment of the present disclosure.

The laser wavelength, power, pulse duration, frequency, and scanning speed are selected to produce a deep narrow groove (about 50 to 150 µm deep) in the silicon with a single line scan. Then the scan overlapping distance is adjusted to produce tall ridges with overlapping consecutive scans. After processing the required area, the same number of consecutive overlapping scans is repeated in the 90° direction to produce an array of equally spaced nano or micro (depending on the laser pulse duration and frequency) columns protruding from the silicon surface and shown in FIG. 4.

In one exemplary embodiment of the present disclosure, the pulsed laser ablation may implement a laser wavelength shorter than about 1.2 µm, a laser pulsing frequency higher than about 3 kHz, and a laser pulse width shorter than about 1.5 µs. The pulsed laser ablation may implement a laser power flux $F_d \geq 1.9$ Mcal/s, wherein:

$$F_d = (T_m - T_a)\frac{\sqrt{\pi K \rho C_v}}{2\sqrt{t_p}},$$

where $T_m \approx 1410$ ° C.; (Si melting temperature); $T_a \approx 25$ ° C.; $K \approx 0.31$ cal·cm$^{-1}$° C.$^{-1}$ (thermal conductivity of Si); $\rho \approx 2.3296$ g·cm$^{-3}$ (density of Si); and $C_v \approx 1673$ cal/(g-° C.) (heat capacity of Si); $t_p \approx 0.0005$ s (minimum laser pulse width).

The formation of periodic arrays of nano or micro columns results from local rapid melting and solidification of the top surface layer due to the effect of thermal waves created by a large number of laser pulses and linear sample transaction. During such melting, the top interdigitated Gd/B layer materials form with silicon an alloy that contains Gd and B atoms. Therefore at least the top surface layer of nano or micro columns formed during the lased processing will have a high concentration of Gd and B atoms, which will enable efficient neutron absorption capabilities of the laser structured layer. In addition, the p-type conductivity of at least the top part of the nano or micro column surface layer will result from the over compensation of the n-type dopant in silicon by Gd and B acceptors.

The next step is sputtering of ZrN on the top of nano or micro columns in order to form a window and contact layer for the neutron detector. Ohmic metal contacts are deposited then by using conventional vacuum evaporation or sputtering on the top of ZrN layer and the bottom of the silicon substrate. Similarly to the first embodiment, the device structure of the second embodiment can be fabricated as a multi-pixel device with individual pixels addressing in order to enable imaging capabilities.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

EXAMPLES

Figure 5:
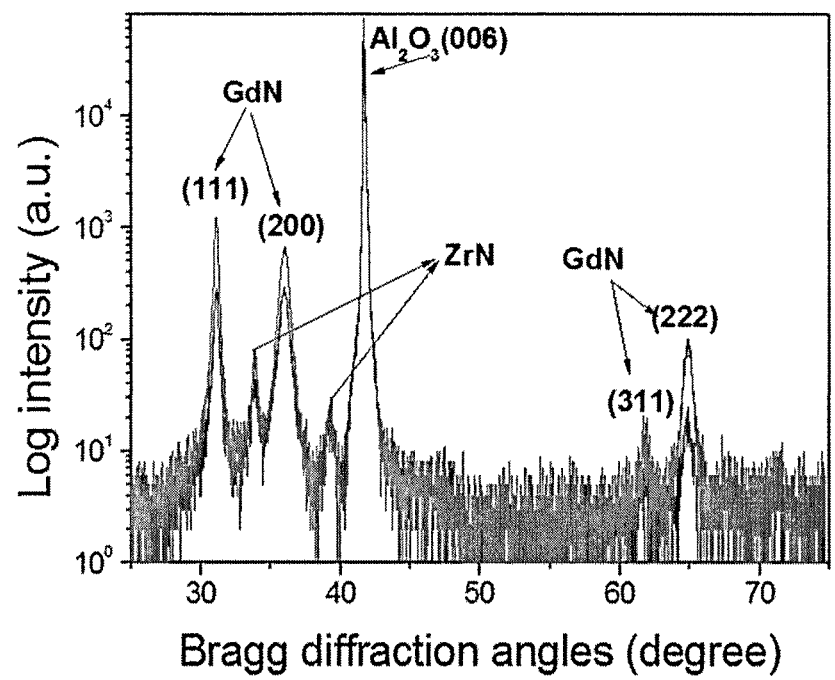
FIG. 5 shows an x-ray diffraction pattern of sputtered GdN layers.

Polycrystalline GdN layers by sputter deposition of Gd targets in a nitrogen plasma environment onto sapphire wafers were demonstrated. FIG. 5 shows the x-ray diffraction pattern of the sputtered GdN layers. Gd is very reactive with oxygen and oxidizes rapidly in air, thus the GdN layer was capped with a ZrN layer. While being polycrystalline, the structure is predominantly of (111) or (100) orientation.

Figure 6:
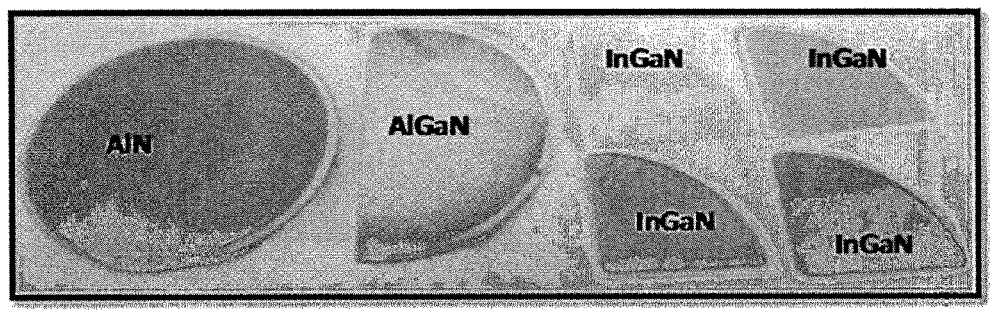
FIG. 6 shows high quality AlN and AlGaN films grown on a silicon substrate and InGaN film grown on a sapphire substrate.

Optimization of III-Nitride growth conditions resulted in high quality films for applications in UV/IR photodetectors, solar cells, LEDs, cold cathode devices, enhancement of MCP performance, avalanche LEDs, and many other devices. FIG. 6 shows high quality AlN and AlGaN films grown on silicon, and InGaN film grown on sapphire. For the InGaN films the color variation is observed due to a different content of In in $In_xGa_{i-x}N$.

Figure 7:
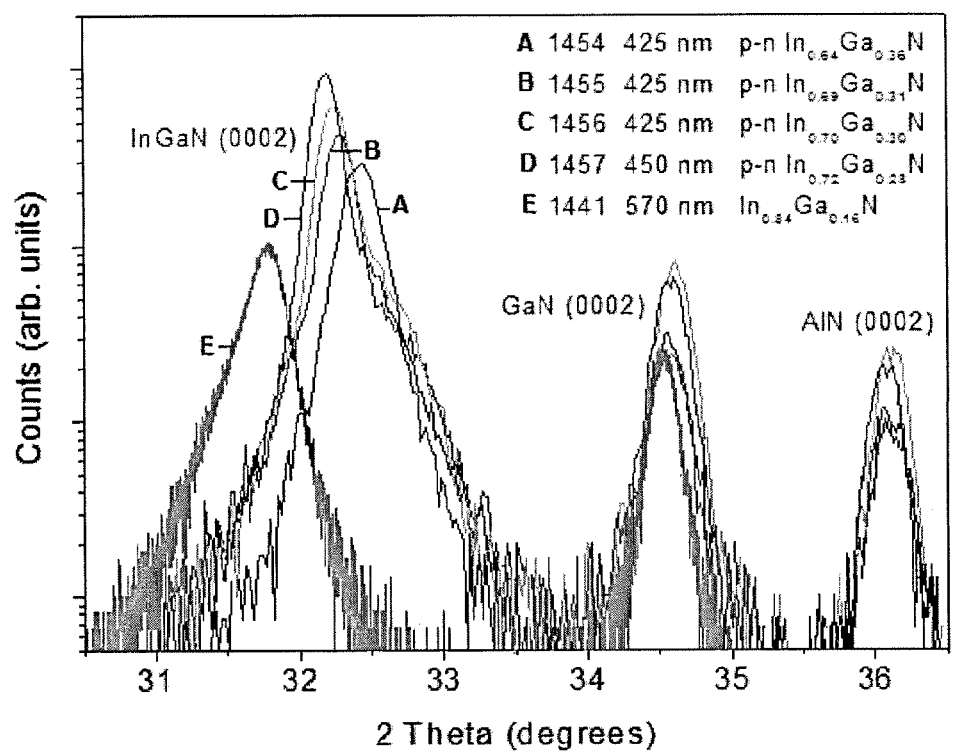
FIG. 7 shows x-ray data for p-n junction InGaN devices with thickness 425-450 nm and various indium compositions, along with a 570 nm $In_{0.84}Ga_{0.16}N$ single layer for reference.

High quality InGaN films grown using a custom built RF Plasma Assisted Molecular Beam Epitaxy (PAMBE) system have been confirmed by x-ray data shown in FIG. 7. Presence of (0002) InGaN peak is evidence of the high quality single crystalline InGaN layers with no phase separation.

Figure 8:
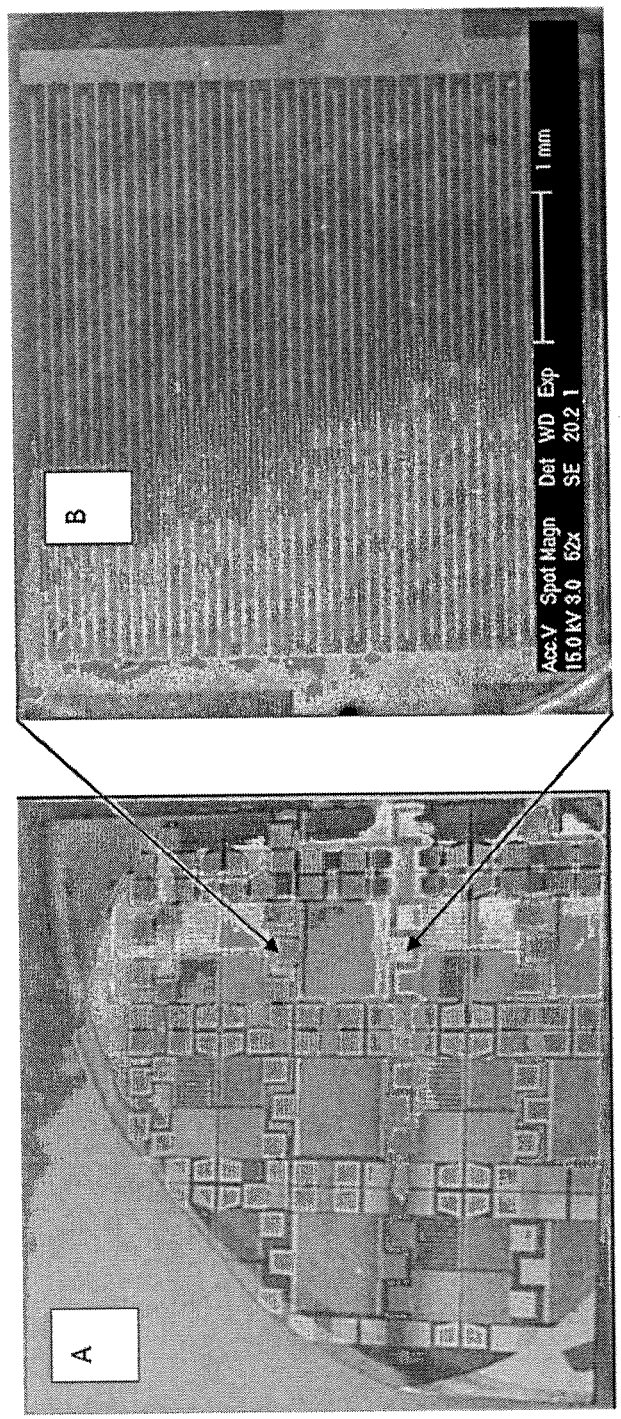
FIG. 8 shows front illuminated photodiode structures.
Figure 9:
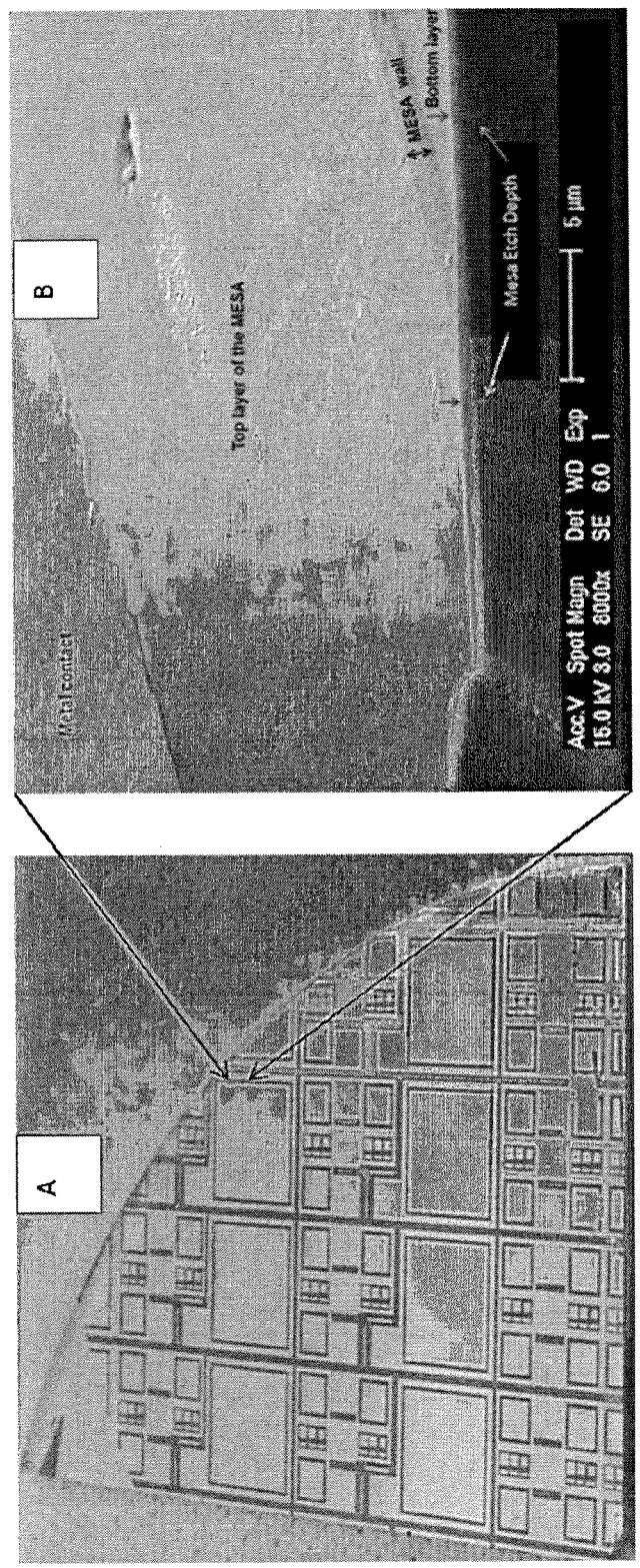
FIG. 9 shows back illuminated photodiode structures.

FIG. 8 and FIG. 9 show front and back illuminated photodiode structures, respectively. The silicon substrate was also used as a visible light passive filter in the back illuminated structures to generate the narrow band IR response shown in FIG. 10.

Figure 10:
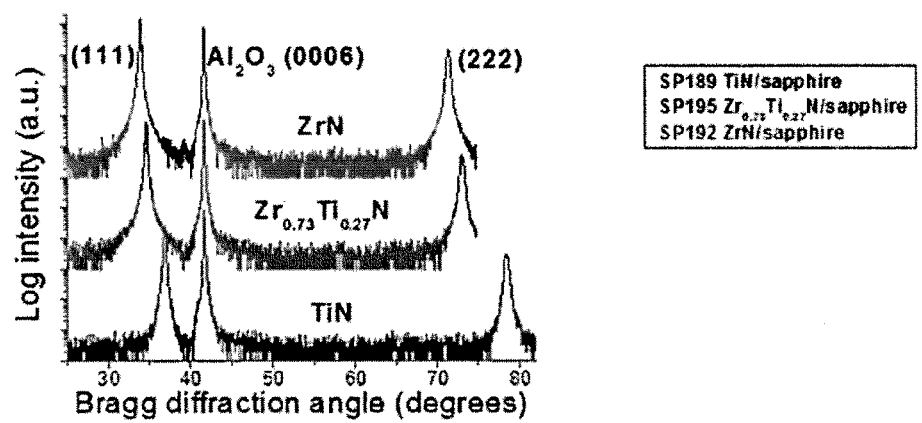
FIG. 10 shows x-ray diffraction data for various sputtered layers (including ZrN) deposited on sapphire substrates.

High crystalline quality nitride layers deposited on sapphire substrates have been demonstrated by using RF assisted magnetron sputtering system equipped with high temperature substrate capability. FIG. 10 shows the X-Ray Diffraction (XRD) spectroscopy data for various (including ZrN) layers deposited by using the above method on sapphire ($Al_2O_3$) substrates.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

What is claimed is:

1. A solid-state neutron detector device comprising:
   a layered structure, having the following layers interposed relative to one another as follows:
   a first contact;
   a capping layer;
   a neutron absorption layer comprising a plurality of interdigitated layers of at least two distinct materials, wherein the plurality of interdigitated layers comprises a first material layer and a second material layer, wherein the first material layer comprises lithium nitride, boron nitride, gadolinium nitride, or a combination thereof, wherein the second material layer comprises indium nitride or other materials, and wherein the first and second material layers have a lattice mismatch of no greater than about 0.4%;
   a graded layer;
   a substrate further comprising a top substrate layer; and
   a second contact.

2. The device of claim 1, wherein the top substrate layer is comprised of gallium nitride.

3. The device of claim 1, wherein the graded layer reduces material structure defects associated with lattice mismatch between the top substrate layer and the neutron absorption layer.

4. The device of claim 1, wherein the graded layer comprises gallium nitride, indium gallium nitride, indium nitride, or a combination thereof.

5. The device of claim 1, wherein the total thickness of the first material layer is between about 6 µm to about 12 µm.

6. The device of claim 1, wherein the capping layer comprises zirconium nitride, titanium nitride or other materials which prevent oxidation of the neutron absorption layer.

7. The device of claim 1, wherein the second contact is composed of a metal or combination of metals making it Ohmic to the top substrate layer.

8. The device of claim 1, wherein the neutron absorption layer and the top substrate layer form a p-n junction.

9. The device of claim 1, wherein at least one of the plurality of interdigitated layers or grading layer exhibits dielectric properties.

10. The device of claim 1, wherein all of the layers are electrically conductive.

11. A solid-state neutron detector device comprising:
    a layered structure, having the following layers interposed relative to one another as follows:
    a first contact;
    a capping layer;
    a neutron absorption layer comprising a plurality of micro- or nano- column structures of at least two distinct materials;
    a substrate; and
    a second contact.

12. The device of claim 11, wherein the substrate comprises a semiconductor silicon wafer.

13. The device of claim 12, wherein the semiconductor silicon wafer has an n-type doping concentration from about $10^{14}$ cm$^{-3}$ to about $10^{18}$ cm$^{-3}$.

14. The device of claim 11, wherein the plurality of micro- or nano- column structures comprise gadolinium, boron, lithium, or a combination thereof, and wherein the micro- or nano- column structures have a height-to-base diameter aspect ratio of at least about 1.5.

15. The device of claim 11, wherein the plurality of micro- or nano- column structures comprise doped semiconductor silicon.

16. The device of claim 11, wherein the neutron absorption layer has a p-type doping.

17. The device of claim 11, wherein the capping layer comprises zirconium nitride, titanium nitride, or other materials which prevent oxidation of the neutron absorption layer and are transparent to neutrons.

18. The device of claim 11, wherein all of the layers are electrically conductive.

19. The device of claim 11, wherein the neutron absorption layer and the substrate form a p-n junction.

20. The device of claim 11, wherein at least one of the materials of the neutron absorption layer exhibits dielectric properties.

* * * * *